United States Patent [19]

Mosher et al.

[11] Patent Number: 5,034,337
[45] Date of Patent: Jul. 23, 1991

[54] METHOD OF MAKING AN INTEGRATED CIRCUIT THAT COMBINES MULTI-EPITAXIAL POWER TRANSISTORS WITH LOGIC/ANALOG DEVICES

[75] Inventors: Dan M. Mosher; Cornelia H. Blanton; Joe R. Trogolo, all of Plano; Larry Latham, Garland; David R. Cotton, Plano, all of Tex.

[73] Assignee: Texas Instruments Incorporated, Dallas, Tex.

[21] Appl. No.: 576,136

[22] Filed: Aug. 29, 1990

Related U.S. Application Data

[63] Continuation of Ser. No. 309,452, Feb. 10, 1989, abandoned.

[51] Int. Cl.⁵ .................. H01L 21/331; H01L 21/74; H01L 21/76
[52] U.S. Cl. ........................................ 437/31; 437/32; 437/74; 437/76; 437/77; 437/55; 437/51; 437/34; 437/57; 437/26; 437/31; 437/75; 148/DIG. 11; 357/34; 357/35; 357/37; 357/44
[58] Field of Search .......................... 437/26, 31, 77; 148/DIG. 11

[56] References Cited

U.S. PATENT DOCUMENTS

| 3,430,110 | 2/1969 | Goshgarian | 437/74 |
| 3,971,059 | 7/1976 | Dunkley et al. | 437/74 |
| 4,069,068 | 1/1978 | Beyer et al. | 437/31 |
| 4,076,556 | 2/1978 | Guerena | 357/44 |
| 4,110,125 | 8/1978 | Beyer | 437/31 |
| 4,111,720 | 9/1978 | Michel et al. | 437/31 |
| 4,122,482 | 10/1978 | Bonis et al. | 357/44 |
| 4,168,997 | 9/1979 | Compton | 357/34 |
| 4,236,294 | 12/1980 | Anatha et al. | 437/31 |
| 4,260,999 | 4/1981 | Yoshioka | 437/31 |
| 4,403,395 | 9/1983 | Curran | 437/74 |
| 4,412,376 | 11/1983 | DeBor et al. | 437/31 |
| 4,654,960 | 4/1987 | McLevige et al. | 357/34 |
| 4,855,244 | 8/1989 | Hutter et al. | 437/31 |
| 4,936,928 | 6/1990 | Shaw et al. | 437/77 |
| 4,957,875 | 9/1990 | Akbar et al. | 148/DIG. 11 |

FOREIGN PATENT DOCUMENTS 3005384  8/1980  Fed. Rep. of Germany .

OTHER PUBLICATIONS

A. Andreine, C. Contiero, P. Galbiati, "A New Integrated Silicon Gate Technology Combining Bipolar Linear, CMOS Logic, and DMOS Power Parts," *IEEE Transactions on Electron Devices*, vol. ED-33, No. 12, 12/86, pp. 2025–2030.
S. Sutton, D. Mosher, & R. Shear, "A Modified BIDFET Process Technology for Symmetric Electroluminescent Display Drivers," *SID 86 Digest*, pp. 181–183.
L. Berardinis, "Powerful Chips Drive Automotive Electronics," *Machine Design*, Apr. 26, 1990, pp. 61–64.
R. Wrathall, D. Tam, L. Terry, S. Robb, "Integrated Circuits for the Control of High Power," *IEDM* 83, pp. 408–411.

Primary Examiner—Brian E. Hearn
Assistant Examiner—Gordon V. Hugo
Attorney, Agent, or Firm—B. Peter Barndt; James T. Comfort; Melvin Sharp

[57] ABSTRACT

A process of fabricating semiconductor devices involving plural epitaxial layer growth steps.

10 Claims, 18 Drawing Sheets

METHOD OF MAKING AN INTEGRATED CIRCUIT THAT COMBINES MULTI-EPITAXIAL POWER TRANSISTORS WITH LOGIC/ANALOG DEVICES

This application is a continuation of application Ser. No. 07/309,452, filed Feb. 10, 1989 now abandoned.

BACKGROUND OF THE INVENTION

I. Field of the Invention

The present invention relates generally to bipolar transistors and, more particularly, to an integrated circuit having various types of bipolar analog and digital, NPN and PNP transistors and the process for fabricating same.

II. Description of the Related Art

Since the middle 1970's the semiconductor industry has endeavored to develop integrated circuits that would handle the higher current and voltage requirements necessary to interface man and his machines. Interfacing continues to be a difficult problem due to the inherent limitations on power handling of device structures fabricated by conventional integrated circuit processes. For example, early bipolar processes were developed using either PNP or NPN vertical power transistors. These processes were primarily compromises that either built power components using standard logic processes resulting in very poor power handling capability and limited safe operating area performance, or when power processes have been used, the long diffusion temperature cycles and heavy dopant concentrations required have yielded only the most crude and basic logic functions with very low density capabilities.

Modern trends to solve the above problems have been to combine Diffused Channel MOS (DMOS) transistors as a power device with bipolar devices and later with high density CMOS logic. One of the primary successes of this DMOS/CMOS-bipolar technology is that higher logic densities have been possible, opening the door to integrated circuits that could handle medium power with high logic density. The major drawback to this technology becoming widely used is that DMOS technology has proved to be less rugged than bipolar components. Another problem is that there appears to be a division of the voltage levels at which each technology performs best DMOS solutions excel below 60 volts, bipolar solutions excel above 200 volts. The best choice for the middle ranges depends on the specific applications.

Therefore it should be apparent that a need exists for a semiconductor process that enables the combination of high power bipolar transistors with either bipolar or CMOS logic and analog circuitry without the voltage, current and ruggedness compromises typically associated with merged technologies.

SUMMARY OF THE INVENTION

In accordance with the teachings of the present invention, the disclosed multi-epitaxial bipolar fabrication process reduces or eliminates the disadvantages and shortcomings associated with relevant prior art methods for forming power and analog/digital integrated circuits. Briefly the present invention comprises an N+ wafer/substrate with three layers of epitaxially grown silicon of which the first is N-type, the is second p-type and the third is N-type. A vertical NPN power transistor is formed with the substrate being the collector, the P-epi the base and the top N-epi the emitter.

A power vertical/lateral PNP transistor is fabricated which also takes full advantage of the multiple epitaxial features of the process by utilizing the P-epi as part of the collector and the top N-epi being the base.

In another embodiment, the NPN transistor can be operated with the N+ substrate acting as an emitter and the top epitaxial layer as the collector.

In yet another embodiment, multiple NPN power transistors are fabricated using the N+ substrate as a common terminal.

In yet another embodiment, an implanted P layer may supplement or replace the P epitaxial layer as base.

In an alternative embodiment, either or both of the N-type epitaxial layers are deposited by a two-step process. Each step resulting in a partial layer having different doping concentrations or additional diffusions in between to tailor an individual device for a particular application.

The top epitaxial layer is fabricated such that various types of logic/analog components can be fabricated therein such as standard bipolar TTL, I2L or metal gate CMOS.

In yet another embodiment of the present invention, an IC combining any or all of the different bipolar and MOSFET devices can be fabricated. Such complementary high power/logic biploar-MOSFET (CBiCMOS) device is adaptable for smart power IC applications.

The novel features which characterize the present invention are defined by the appended claims. The foregoing and other features, benefits, advantages and embodiments of the invention will hereinafter become apparent. For purposes of illustration only, and not of limitation, a preferred embodiment is depicted in the accompanying drawings and described hereinafter.

BRIEF DESCRIPTION OF THE DRAWINGS

Further features and advantages and variations of the present invention will become more apparent from the following and more particular and detailed description of the invention, when read in view of the following drawing figures, wherein.

For ease of illustration, all diffusions are assumed to be complete in the designated cross section, whereas in reality certain diffusions are interrupted for other implants or depositions and may not be complete until subsequent thermal cycles are completed.

DETAILED DESCRIPTION OF THE PREFERRED EMBODIMENTS

Figure 1:
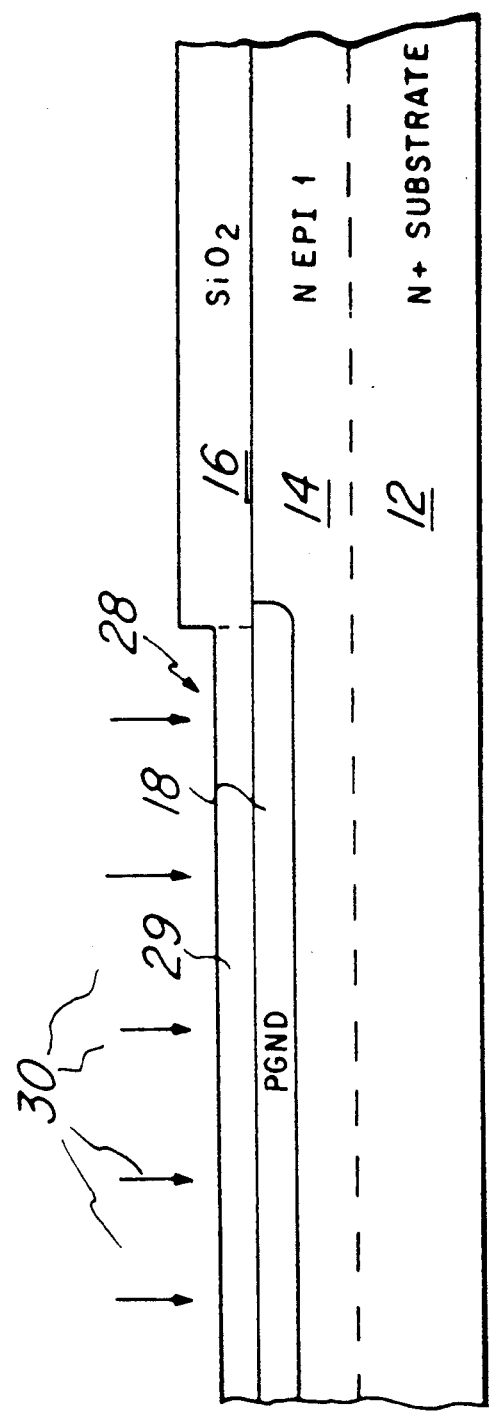
FIGS. 1 through 10 are enlarged cross sections of a semiconductor wafer, not to scale, serving to illustrate the sequence of process steps for the fabrication of ICs in accordance with the present invention.

Referring now to the drawings, wherein like reference characters designate like or corresponding parts throughout the several views, FIG. 1 depicts a schematic cross-section of a single crystalline substrate wafer 12 used in a preferred embodiment of the present invention. FIG. 1, depicts for purposes of simplicity, only part of a full semiconductor substrate as used according to the present process. It is to be understood that the substrate is in fact sufficiently sized for fabrication of all the various types of semiconductor devices described herein. Processing steps which are applicable to multiple device structures will be noted herein. Therefore, processing steps not specifically described or depicted in the drawings are deemed to be well known to one of ordinary skill in the art of semiconductor processing. Wafer 12 has a <100> crystal orientation, is N-type doped, and has a resistivity of approximately 0.01 to 0.02 Ohm-cm. A first N-type epitaxial (epi) layer 14 is formed on a surface of wafer 12. Epitaxial layer 14 may be deposited or grown on wafer 12 by conventional and well known methods such as batch reactor, continuous chemical vapor deposition, molecular beam epitaxy, etc. Epi layer 14 is multi-functional and serves as a collector for a vertical NPN transistor. Accordingly its thickness and doping level must be selected according to the desired voltage characteristics and Forward Bias Safe Operating Area (FBSOA) requirements of the individual devices as well as the breakdown voltage requirements between the backside and the ground plane of the IC. In a preferred embodiment a thickness of 24 um and a resistivity of 6.5 Ohm-cm is desired The surface of epi layer 14 is next thermally oxidized to form oxide layer 16 to a thickness of approximately 6500A (angstroms). A layer of photoresist (not shown) is spun over oxide 16. The oxide is then photolithographically patterned and exposed in regions 28 which are to contain a first buried region 18, referred to herein as P-ground (PGND). Alternatively, an E-beam pattern can be used. The preference of photoresist or E-beam resist is immaterial to the present invention. The exposed resist material and underlying oxide are subsequently removed by stripping in a HF bath or other well known method.

Before implantation of the PGND regions, a pre-implant oxide 29 is thermally grown in the exposed regions to a thickness of approximately 825A. The PGND regions 18 are formed by a 110 KeV Boron implant dose of approximately 2.0E14 atms per-cm$^2$ through the pre-implant oxide. The wafer is then subjected to a thermal diffusion for 600 min. at 1200 C. in a nitrogen ambient followed by a 150 min., 950 C. steam. This forms a 5000A oxide layer (not shown) over region 18 and the diffusion has a sheet resistance of 170 ohms/square. P-ground region formation is an optional step in the formation of some types of transistors of the present invention. For example, such PGND regions are beneficial for the present bipolar double diffused high voltage NPN transistors, bipolar double diffused low voltage NPN transistors, bipolar high voltage vertical/lateral PNP transistors, bipolar low voltage lateral PNP transistor and bipolar low voltage substrate PNP transistor.

Figure 2:
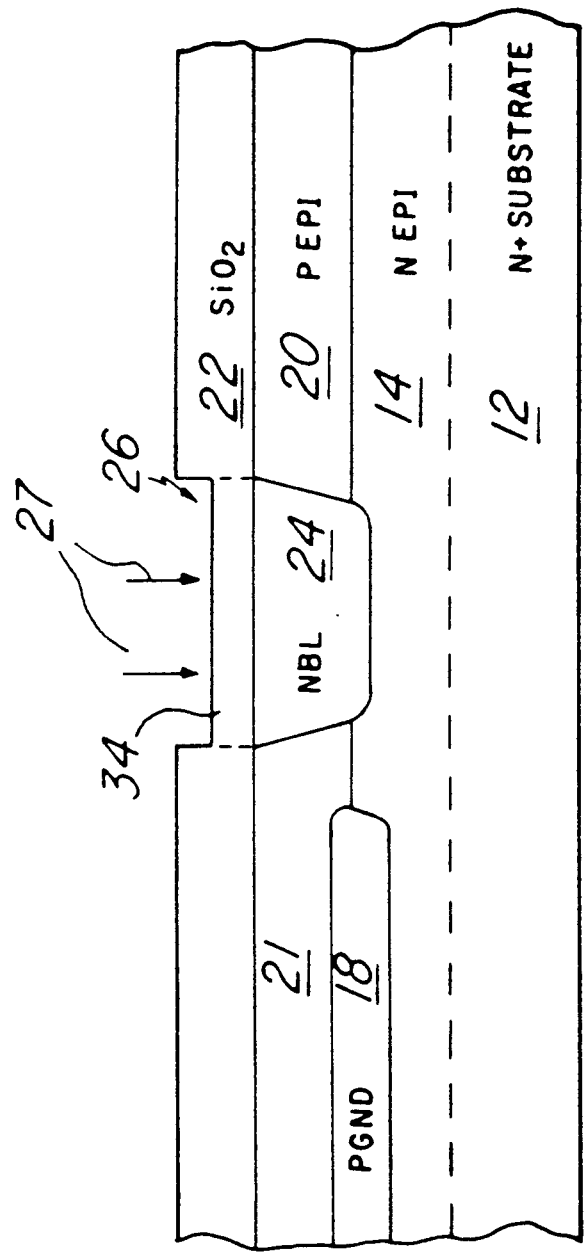

Referring now to FIG. 2, after formation of the first N-type epitaxial layer 14, the overlying oxides are removed and a P-type epitaxial layer 20 is grown over first epitaxial layer 14. In accordance with the teachings of the present invention, the second epitaxial layer also has multiple uses. For example, the second epi layer 20 forms the base region of the vertical NPN transistors, part of the collector of the vertical/lateral PNP transistors and the ground plane for any included control circuitry. This multiple use of the P-epitaxial layer is unique to the present process and is significant to the operation of the various devices on a common wafer. The thickness of the second epitaxial layer is chosen to achieve a reasonable Base Gummel number for the power NPN devices. In a preferred embodiment, a thickness of 10 um and a nominal resistivity of 2.1 ohm-cm is chosen.

Referring again to FIG. 2, the surface of the wafer is shown having been oxidized to form a 6500A oxide layer 22 over P-type epitaxial layer 20. Photoresist (not shown) is spun over the surface of oxide 22 and photolithographically patterned and exposed to form open regions 26 exposing the P epitaxial layer surface, whereat N-type buried layers 24, referred to herein as NBLs, are to be deposited. The NBL regions are formed by a phosphorus implant 27 dose of 8.0E14 atms per-cm$^2$ at 80 KeV through a 500A pre-implant oxide 34 formed in the exposed regions. Next the wafer is subjected to a 1200 C., 600 min. nitrogen diffusion and a 105 min, 950 C. steam cycle. Subsequent to the steam cycle the NBLs have a sheet resistance of 30 ohms/square and the oxide is grown to a thickness of 4100A. During the diffusion cycle the NBL regions diffuse down sufficiently to completely penetrate the P-epi and thereby provide isolation to separate the P-epi into various regions. It should also be noted that during this and other temperature cycles, the implanted or diffused buried regions diffuse toward a final configuration.

Figure 3:
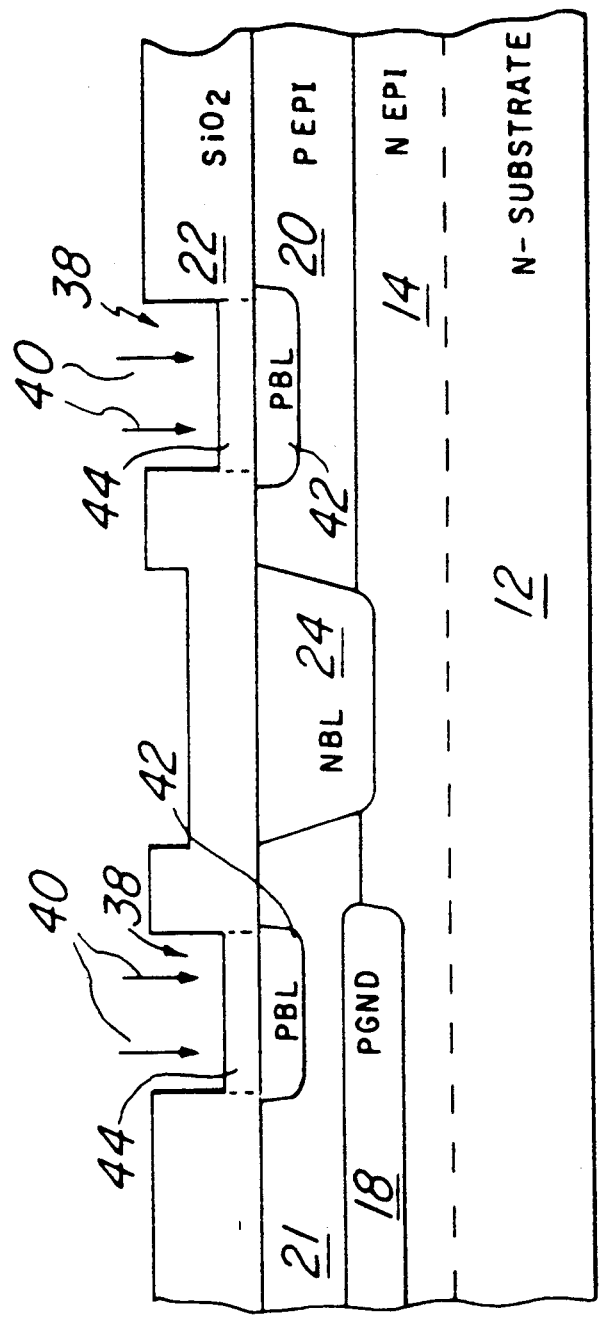

Referring now to FIG. 3, oxide layer 22 has again been photolithographically patterned and exposed to form regions 38 whereat P-type buried layers 42, referred to herein as PBLs, will be formed in the P-epitaxial layer. The PBLs are formed by a Boron implant 40 dose of 2.0E14 atms per-cm$^2$ at 60 KeV through a 825A pre-implant oxide 44 formed on the surface of the wafer. The Boron implant is followed by a 200 min., 1200 C. nitrogen diffusion followed by a 105 min., 950°C. steam cycle. This sequence results in a sheet resistance of 160 ohms/square and a PBL oxide thickness of 4100A. Upon completion of the entire process the PBL sheet resistance will decrease to 130 ohms/square. In some structures PBL regions 42 are formed to provide isolation and separation of a N-type epitaxial layer which will be formed over P-type epitaxial layer 20. PBL regions up-diffuse during processing to join with down diffusing P+ regions which will be formed in the third N-type epitaxial layer as described herein after.

Figure 4:
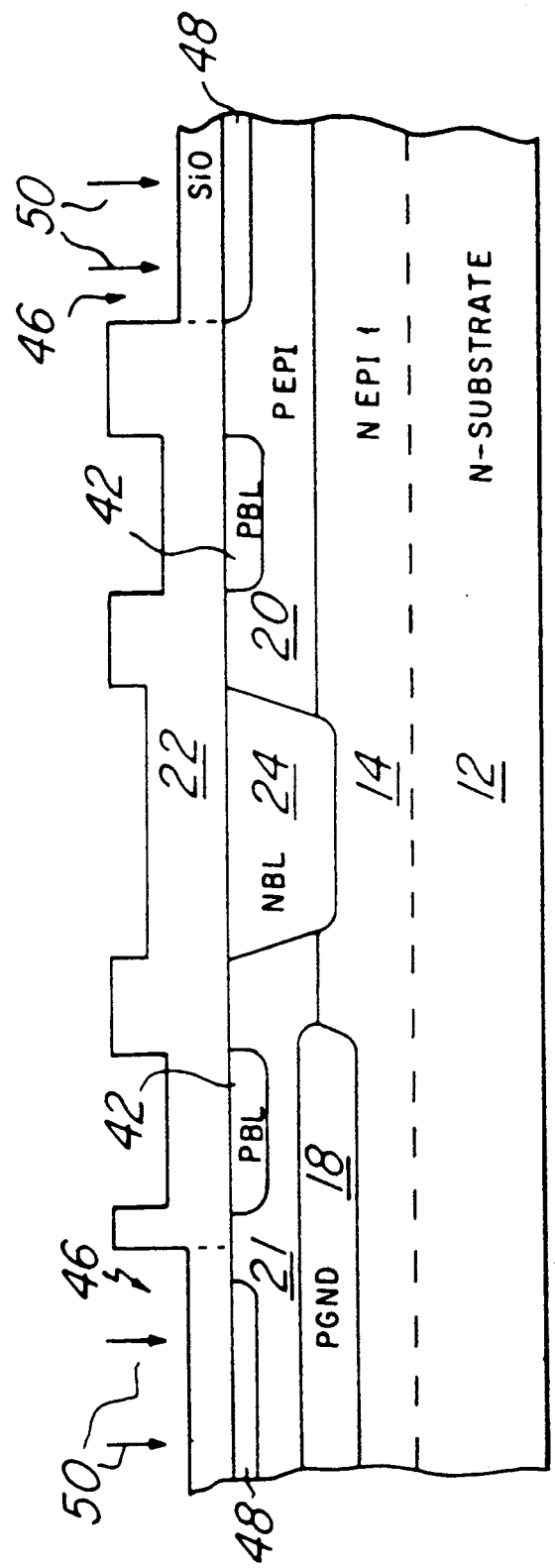

Referring now to FIG. 4, oxide layer 22 has again been patterned (not shown) and exposed to form openings 46 whereat a buried Diffusion Under Film or DUF region 48 is formed in the exposed regions of the wafer. The DUF regions are fabricated using an antimony implant 50 dose of 1.0E15 atms per-cm$^2$ at 60 KeV energy followed by a 200 min., 1200 C. diffusion in a 10% oxygen ambient and a 950 C, 25 min steam cycle. The resultant DUF region has a sheet resistance of 48 ohms/square and an oxide thickness of 2200A. The sheet resistance is reduced during subsequent processing to 33 ohms/square. Examples of some of the devices which may include DUF regions are the bipolar vertical backside collector output NPN transistor, bipolar double diffused low voltage NPN transistor, and bipolar high voltage lateral PNP transistor, bipolar low voltage lateral PNP transistor. The DUF can be photolithographically defined in the emitter region of the bipolar vertical backside collector output NPN transistor to enhance emitter injection efficiency. A DUF can also be used in portions of the circuitry to reduce lateral resistance within a surface tank or to inhibit the punch through of surface devices to the underlying P-epi layer. This list is merely illustrative of the examples and should not be considered exhaustive.

Figure 5:
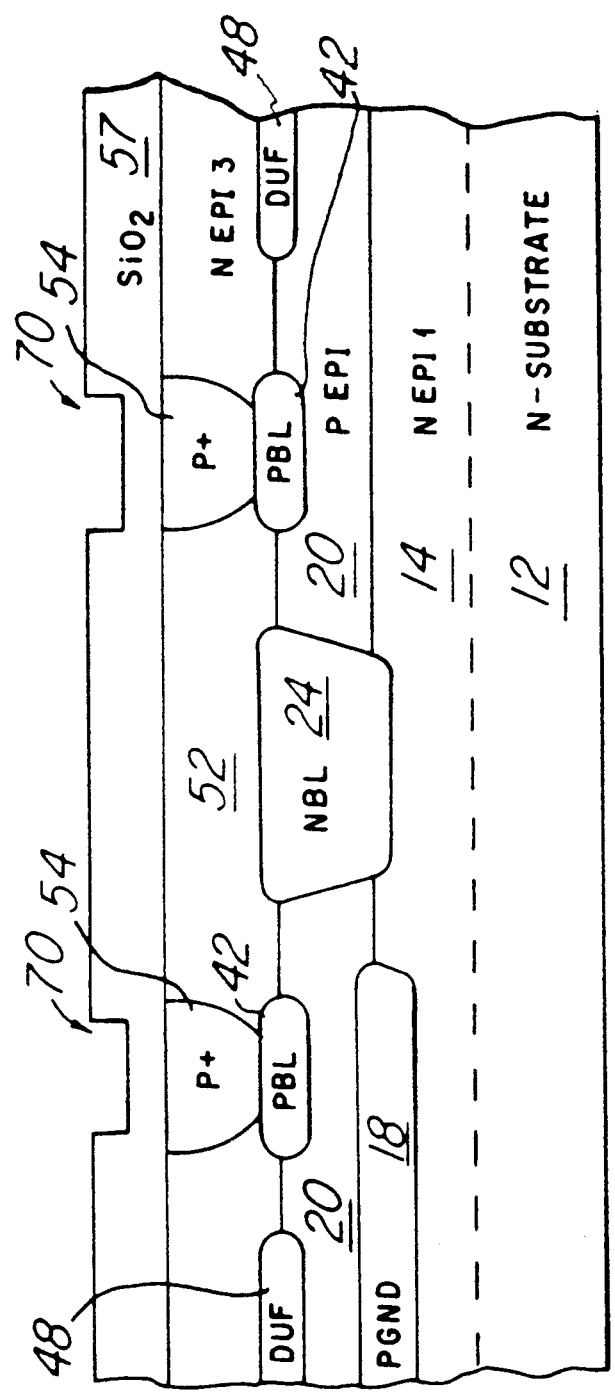

Referring now to FIG. 5, the photoresist material and oxide have been removed and a third, N-type epitaxial layer 52 is grown over the second P-type epitaxial layer 20. In accordance with the teachings of the present invention this layer also can serve different functions depending on which type of active or passive device is formed therein. For example, epitaxial layer 52 forms the emitter of the vertical NPN transistor, the base of the Vertical/lateral power PNP transistor, and serves multiple functions for the control circuitry such as the NPN collector, PNP base, PMOS backgate and possibly high value resistors. Accordingly the thickness and resistivity of epitaxial layer must be selected so as to establish a sufficient breakdown voltage for the Vertical/Lateral PNP and surface logic devices and emitter resistance of the vertical NPN. In a preferred embodiment a nominal resistivity of 3 Ohms-cm and a thickness of 15 um is suitable for a variety of device applications.

Individual epitaxial tank isolation is achieved by the formation of P+ isolation regions 54 in the surface of N-type epitaxial layer 52. The isolation regions can be formed by a variety of methods, such as ion implatation or deposition. In a preferred embodiment, the P+ isolation regions are formed by a surface Boron deposition. The second N-type epitaxial surface is first thermally oxidized to a thickness of 4000A and the P+ regions are photolithographically defined (not shown). In general the P+ regions 54 will coincide with the previously defined PBL regions 42, however this may vary for some devices. The P+ regions 54 are formed through a BBr3 56 thermal deposition at 1100 C. followed by a 1200 C. diffusion cycle that yields a sheet resistance of about 7 ohms/square. Up-diffusion of the sub-surface PBL regions and down diffusion of the co-incident P+ regions combine to form isolation for the surface epi tanks, which will contain the logic components. In addition to providing tank isolation, the PBL-P+ combination also provides a low resistance contact to control the base of the vertical NPN transistor, part of the collector of the Vertical/Lateral PNP and the surface contact for the logic ground plane.

In accordance with the teachings of the present invention conventional masking and patterning techniques may be used to form the desired active and passive devices in the individual tank regions of the present structure. Over some tank regions, the resulting oxide may be used to define an optional Boron implanted region, referred to herein as Lightly Doped Base (LDB). This region may be used to create the base of a vertical, double diffused NPN transistor that will provide higher emitter to base breakdown voltage than would be achievable with a conventional high concentration base region. The lightly doped base regions also provide excellent P-wells for NMOS devices. Additionally, it may driven very deep until it becomes continuous with a sub-surface PBL or P-epi to form for example a very wide base for a vertical NPN. In view of the multiple uses of the lightly doped base regions of the present invention a preferred formation sequence comprises a 825A pre-implant oxidation of the wafer followed by a Boron implant dose of 2.0E13 atms per-cm$^2$ at 80 KeV. This is followed by a 1200 C. diffusion cycle. This sequence results in an oxide thickness of 3800A and a sheet resistance of 1300 ohms/square. The sheet resistance value also makes the LDB regions suitable for moderately valued resistors.

Figure 6:
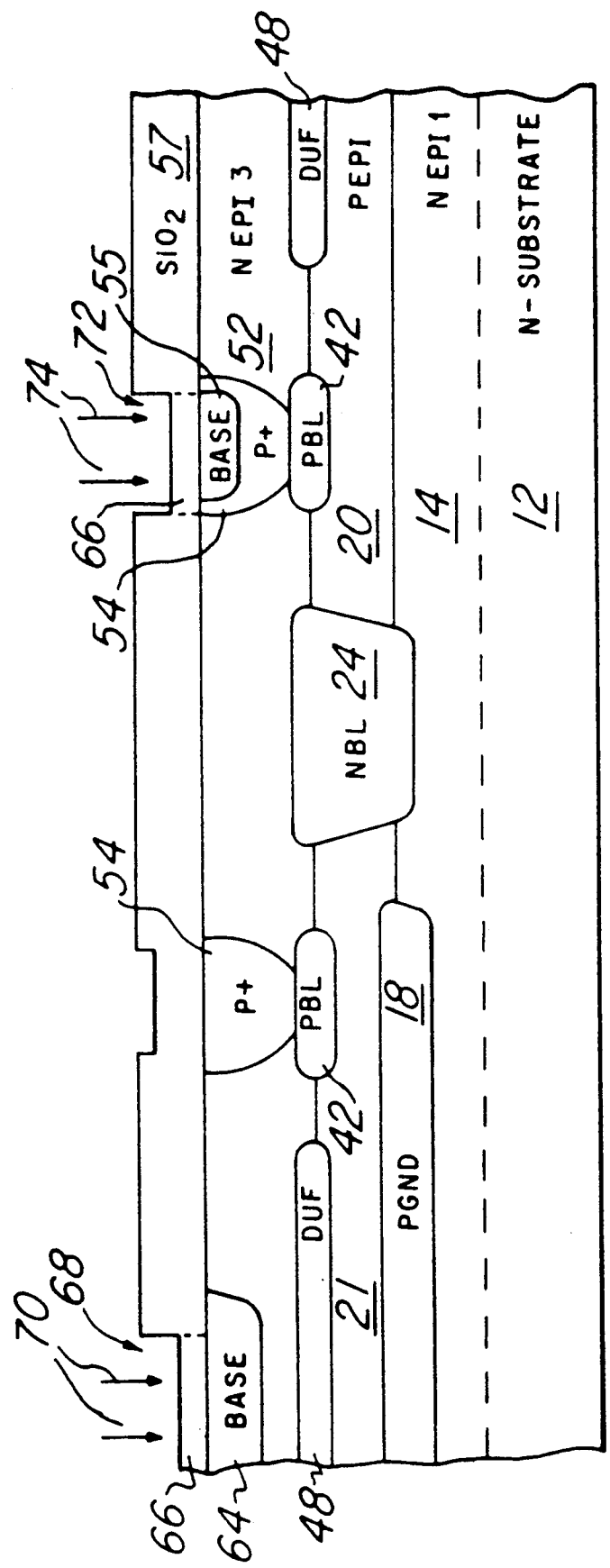

Referring now to FIG. 6, formation of boron implant regions referred to herein as BASE regions 55 and 64 is depicted. It should again be noted that although these regions may be used in the conventional manner as base regions for semiconductor devices, they may also be used to form various other active and passive device components as will be described in more detail hereinafter. Formation of the BASE regions in a preferred embodiment may comprise photolithographically patterning the oxide remaining after the LDB sequence and thermally growing 825A of pre-implant oxide 66 in the exposed regions 68. If a LDB is not formed, the oxide remaining after P+ formation may be used. Thereafter a Boron dose 70 of 6.5E14 atms per cm$^2$ is implanted followed by a 1100 C., 100 min. diffusion in nitrogen and a 1000 C., 42 min. steam cycle. This yields a BASE region having a sheet resistance of 160 ohms/square and an oxide thickness of 3400A. Examples of uses of the BASE regions in the fabrication of logic structures in accordance with the teachings of the present invention, is as the base of the diffused NPN transistors, the emitter and collector of the lateral PNP transistors, the anode of zener diodes as well as low valued resistors. BASE regions may be formed between the P+ isolation regions of a given tank, 68 within the P+ isolation regions 72 or in unisolated tanks as desired for a particular type of transistor.

After completion of the BASE region diffusion, photolithographic definition (not shown) is again used to define regions that are to receive a low dose Boron implant that will form High Sheet Resistors (HSRs) (not shown). In a preferred embodiment the HSRs are formed by a Boron implant dose of 2.3E13 atms per-cm$^2$ at 110 KeV through a 2400A pre-implant oxide formed in the exposed regions as previously described herein before. This sequence yields a final sheet resistance value of 2000 ohms/square.

Figure 7:
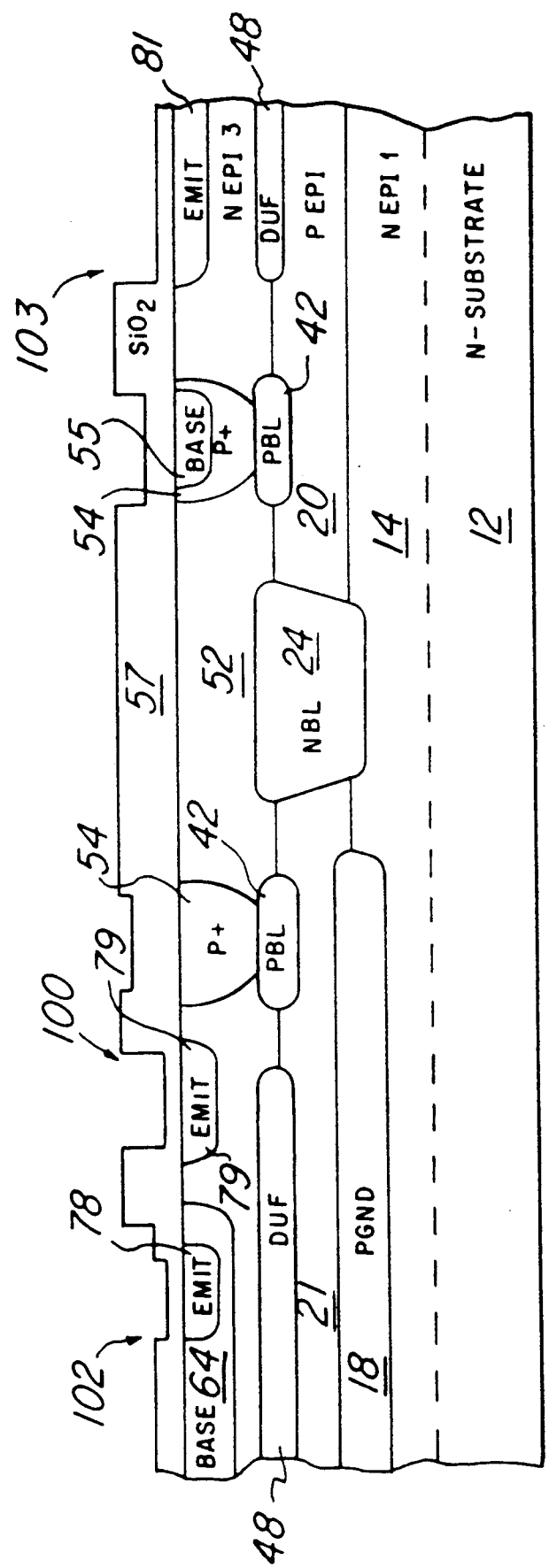

Referring now to FIG. 7, photoresist material (not shown) is again patterned and fabrication of the various device logic components is completed with a deposition and diffusion anneal at 1000 C., of phosphorus regions 78, 79 and 81 referred to herein as EMITTER region. As previously stated herein before, the present process allows usage of conventional doped regions for multiple purposes in the formation of active and passive devices. For example, the EMITTER diffusion sequence results in regions having a sheet resistance of 5 ohms/square, in a preferred embodiment. These regions can be used to provide contact to the surface N-epi tanks. Additionally these regions may be used as the base region for complementary PNP devices. When used in conjunction with the NBL layer, the EMITTER region can be used to provide vertical contact to the N-type wafer substrate. In an alternative embodiment the EMITTER regions can be formed by ion implantation.

When using the present process to fabricate MOS or combined bipolar and MOS type transistors, the process can be varied in the following manner to form metal gate MOS devices. After the EMITTER diffusion, gate areas for MOS devices (either PMOS or NMOS) are patterned photolithographically. Then an 800 angstrom gate oxide is grown at 900 C. The surface of the gate oxide is then lightly phosphorous doped to act as a sodium (Na) getter. A light Boron implant of 1.0E11 to 4.0E11 atms per-cm$^2$ at an energy of 50–60 KeV is then applied to the wafer to set the MOS devices to a desired threshold voltage level of approximately 1.25 volts. The wafers are then given an implant anneal at 850 C. for thirty minutes to activate the implant.

Figure 8:
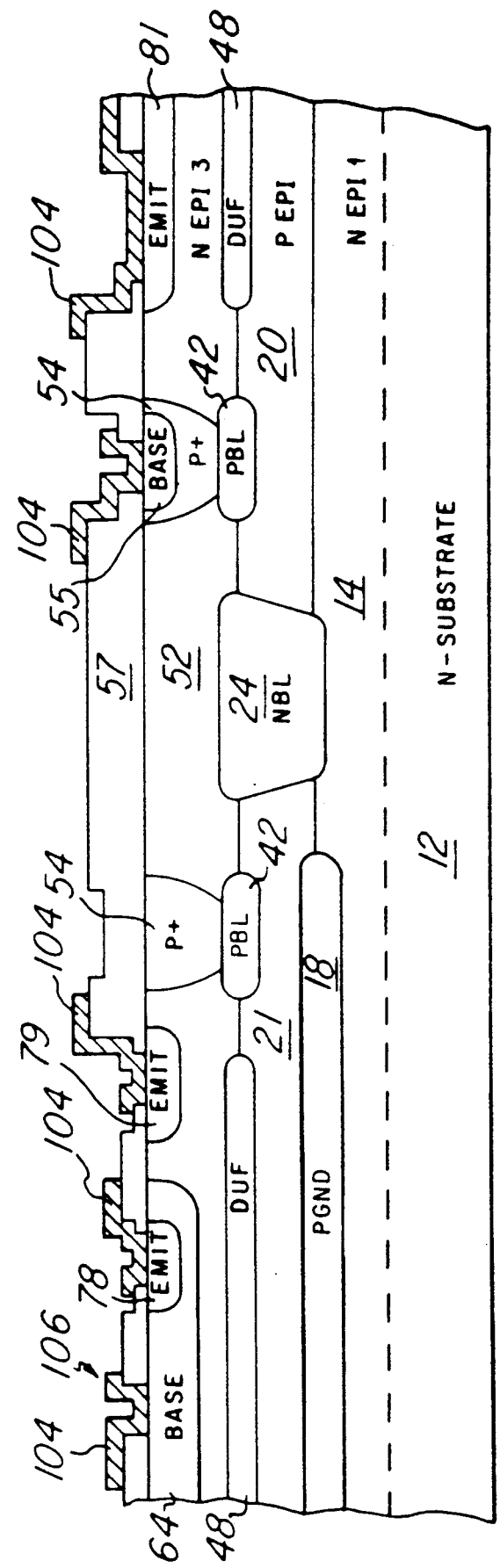

FIG. 8 depicts the wafer following removal of the photoresist and a thermal implant anneal cycle. The final step in the formation of the logic components is completed by using conventional metal and nitride depositions and patterning to form contacts to the activated regions. A sequence of steps in a preferred embodiment may comprise first removing the surface oxide (not shown) formed during BASE and EMITTER diffusions, in the regions to be contacted 106. A 20 KA layer 104 of Al doped with Si and Cu is then sputter deposited and patterned.

Figure 9:
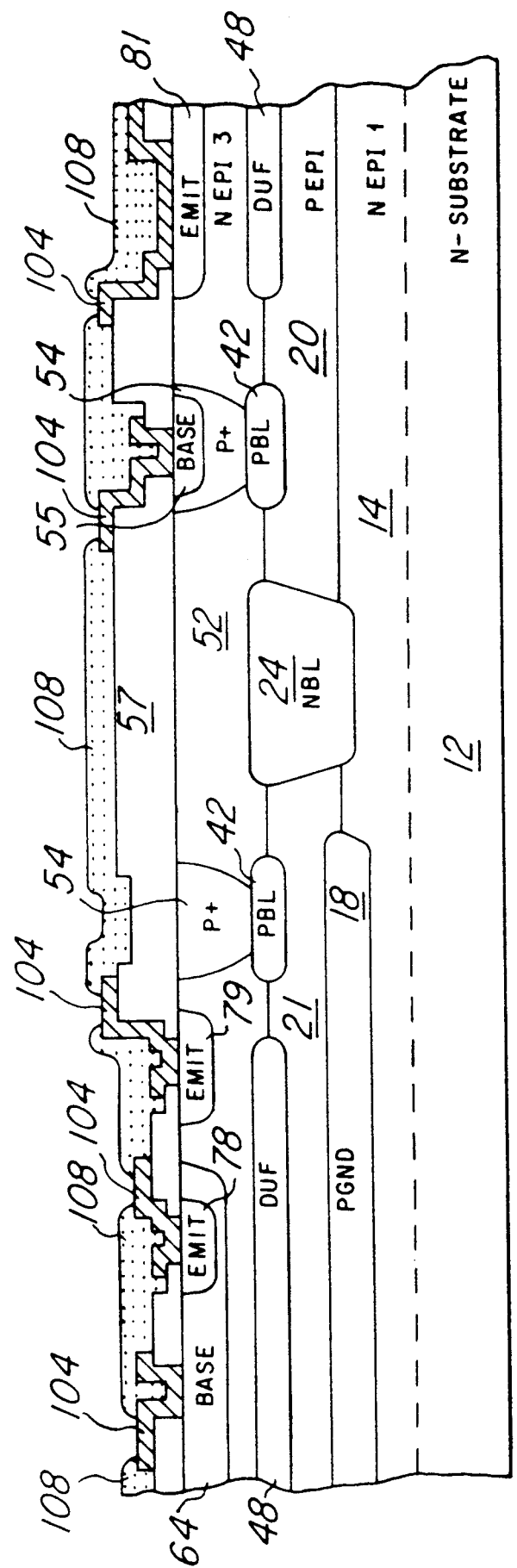

Referring to FIG. 9, the top surface of the wafer is completed with a deposition and etch of a 10 KA nitride layer 108.

Figure 10:
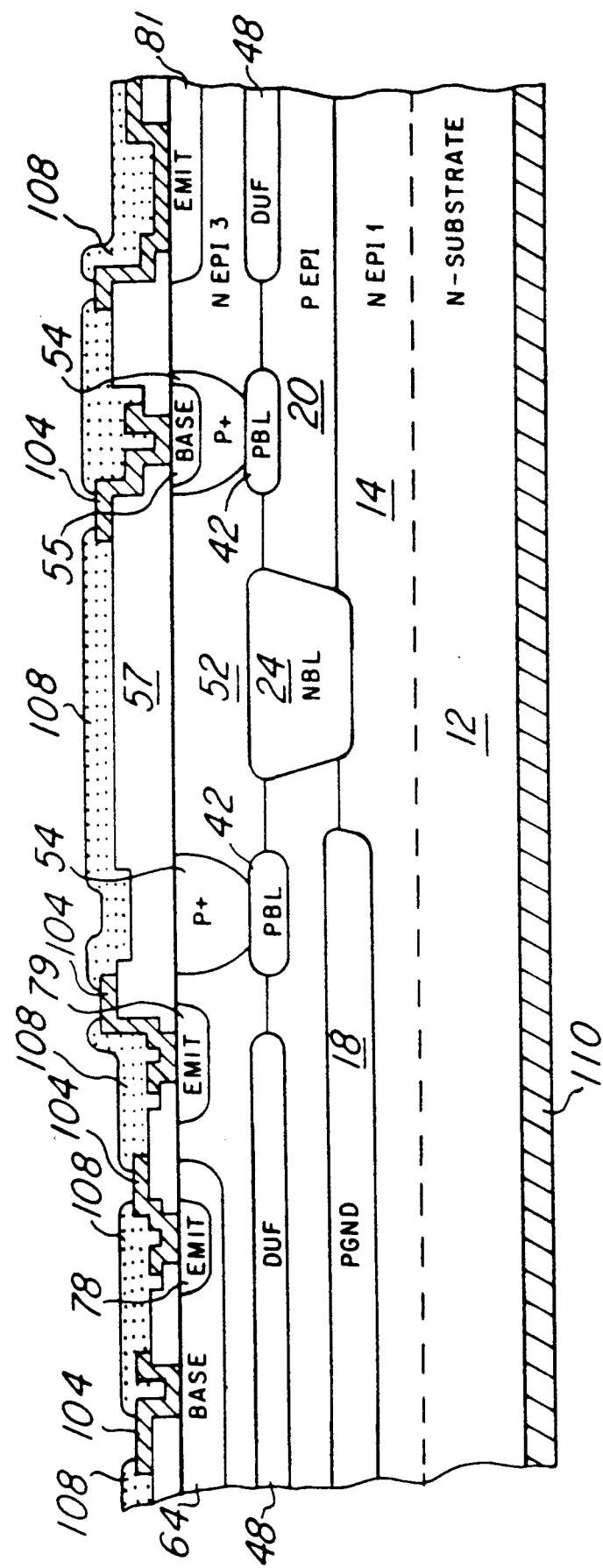

Referring now to FIG. 10, the backside wafer surface is thereafter ground to achieve a final wafer thickness of 15 mils. Thereafter a layer of TiNiAg 110 is deposited on the backside to form a low resistance contact.

Figure 11:
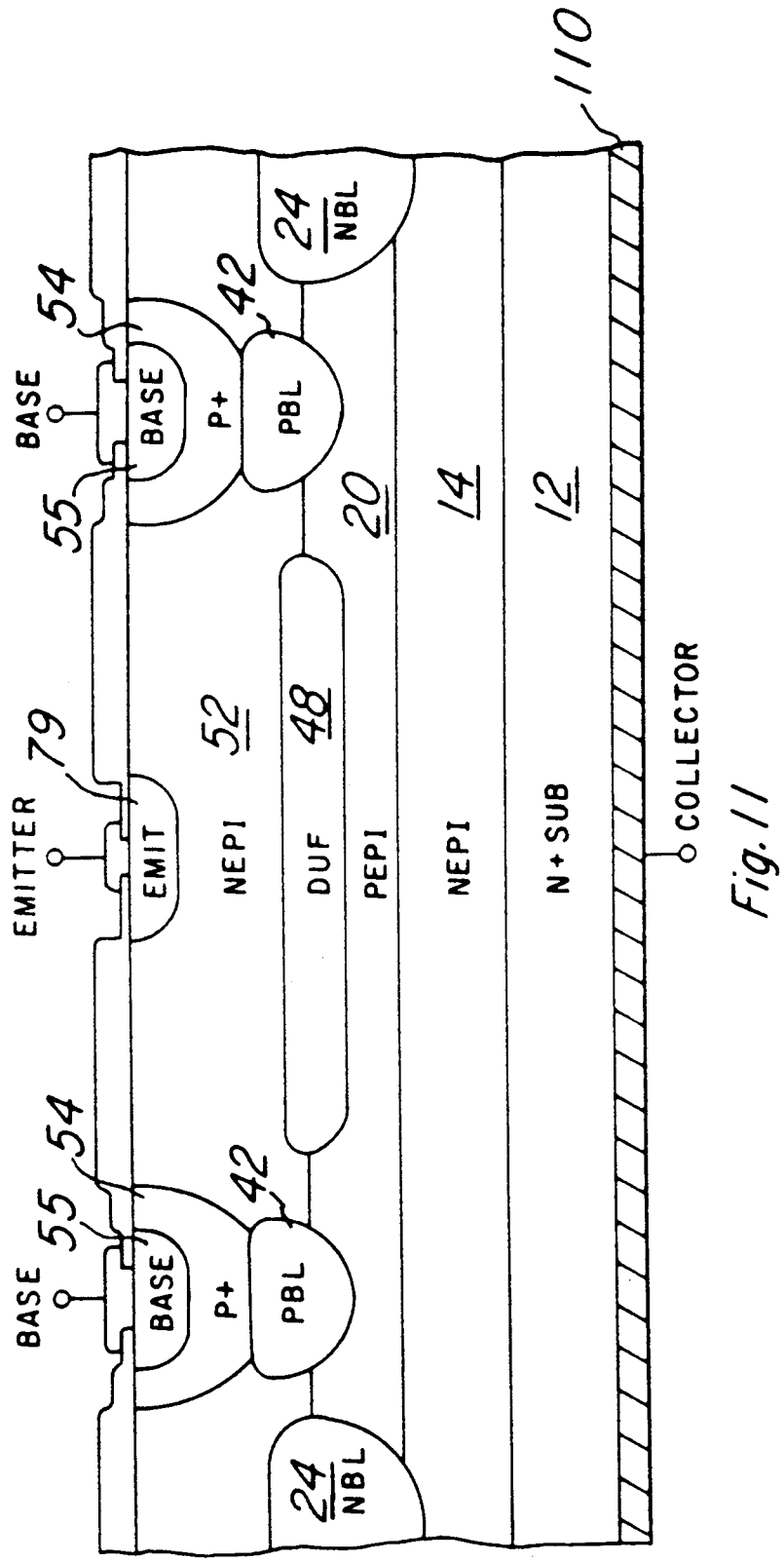
FIGS. 11 through 18 are enlarged cross sections of individual semiconductor devices which are part of a continuous semiconductor integrated circuit.

FIGS. 11 through 19 are intended to depict a continuous IC including several of the different devices which may be fabricated by the disclosed process on a common wafer. FIG. 11 depicts a bipolar vertical backside collector output NPN transistor. As illustrated, the backside TiNiAg layer 110 serves as the collector contact, the base regions are contacted by the P+ isolation regions (the P epitaxial layer is the base), and the EMITTER region serves as the emitter region for the transistor. The transistor of FIG. 11 has excellent high power and high current operating characteristics.

Figure 12:
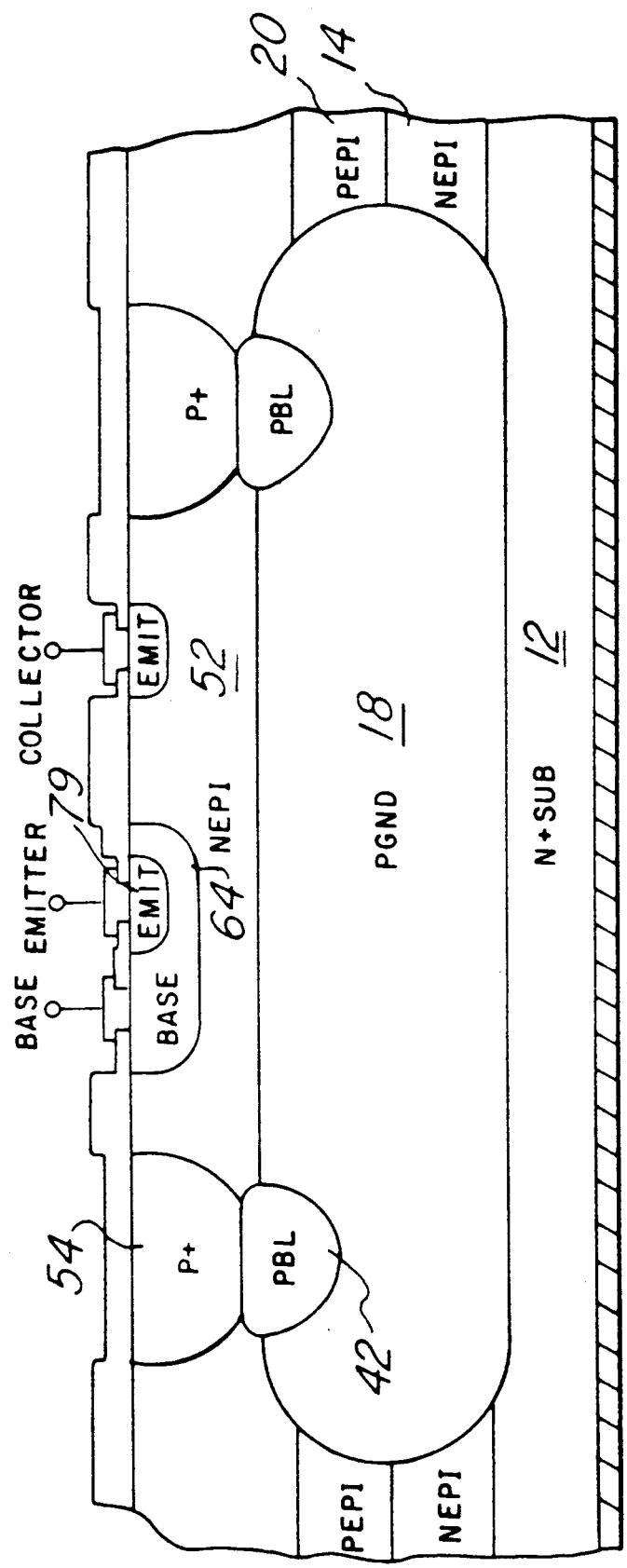

FIG. 12 depicts a bipolar double diffused high voltage NPN transistor. This device has excellent characteristics as a high voltage/low current switch.

Figure 13:
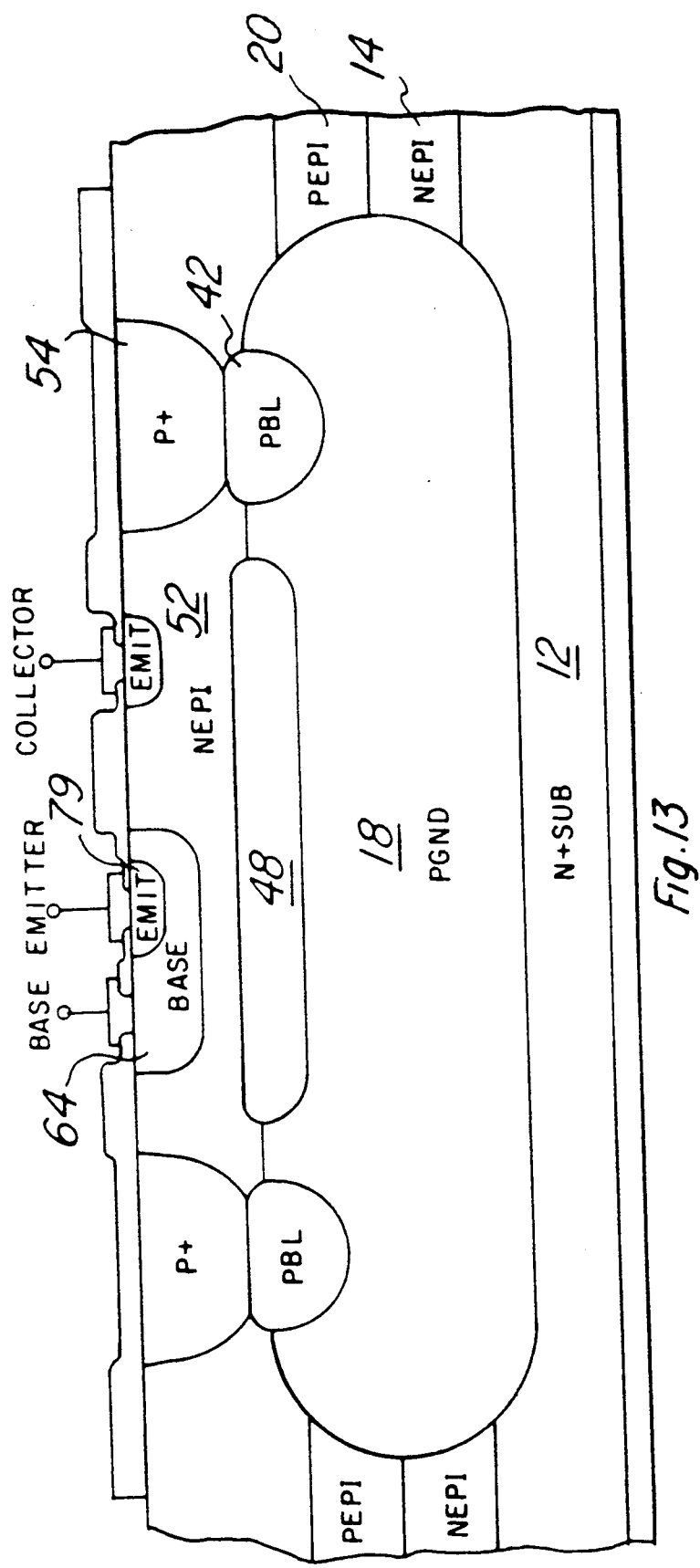

FIG. 13 depicts a bipolar double diffused low voltage NPN transistor. This device provides excellent low voltage and current operating characteristics and is used for logic functions.

Figure 14:
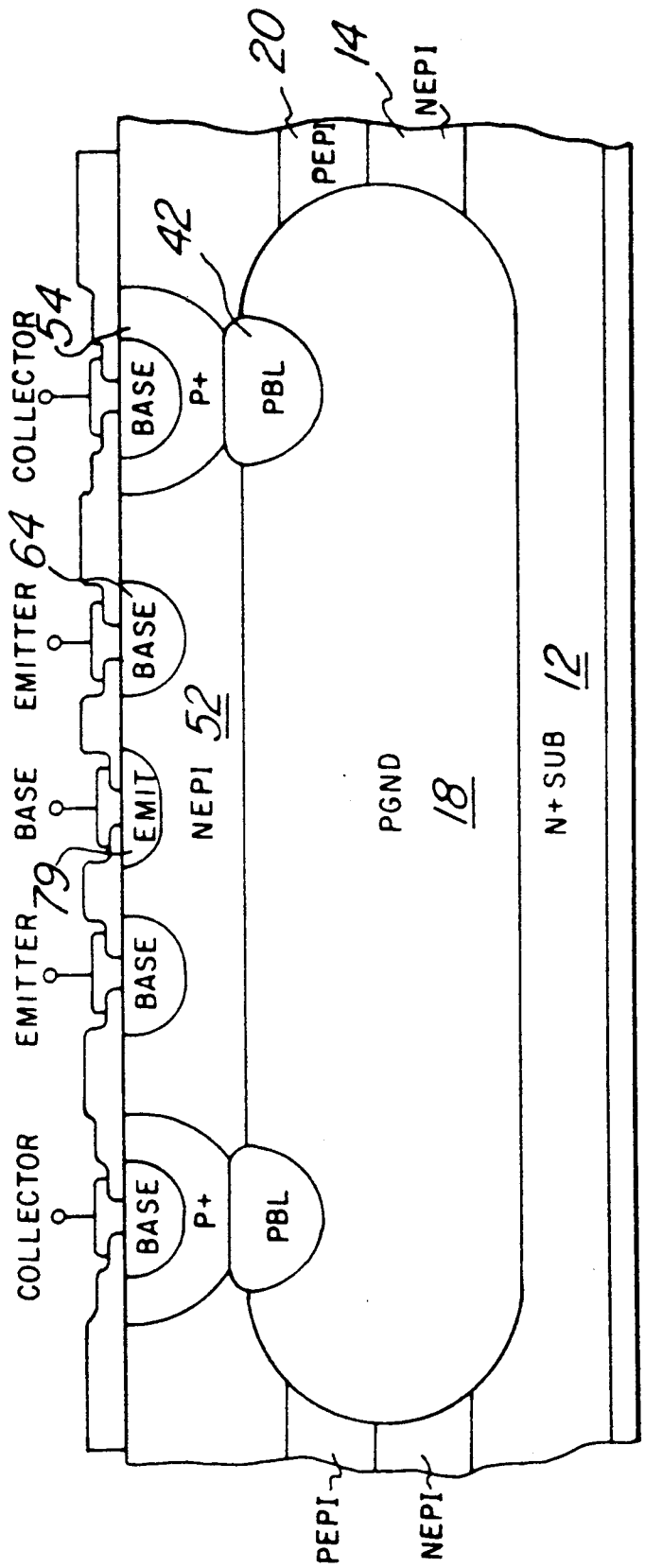

FIG. 14 depicts a bipolar high voltage vertical/lateral PNP transistor. This device has excellent characteristics as a high current-power transistor.

Figure 15:
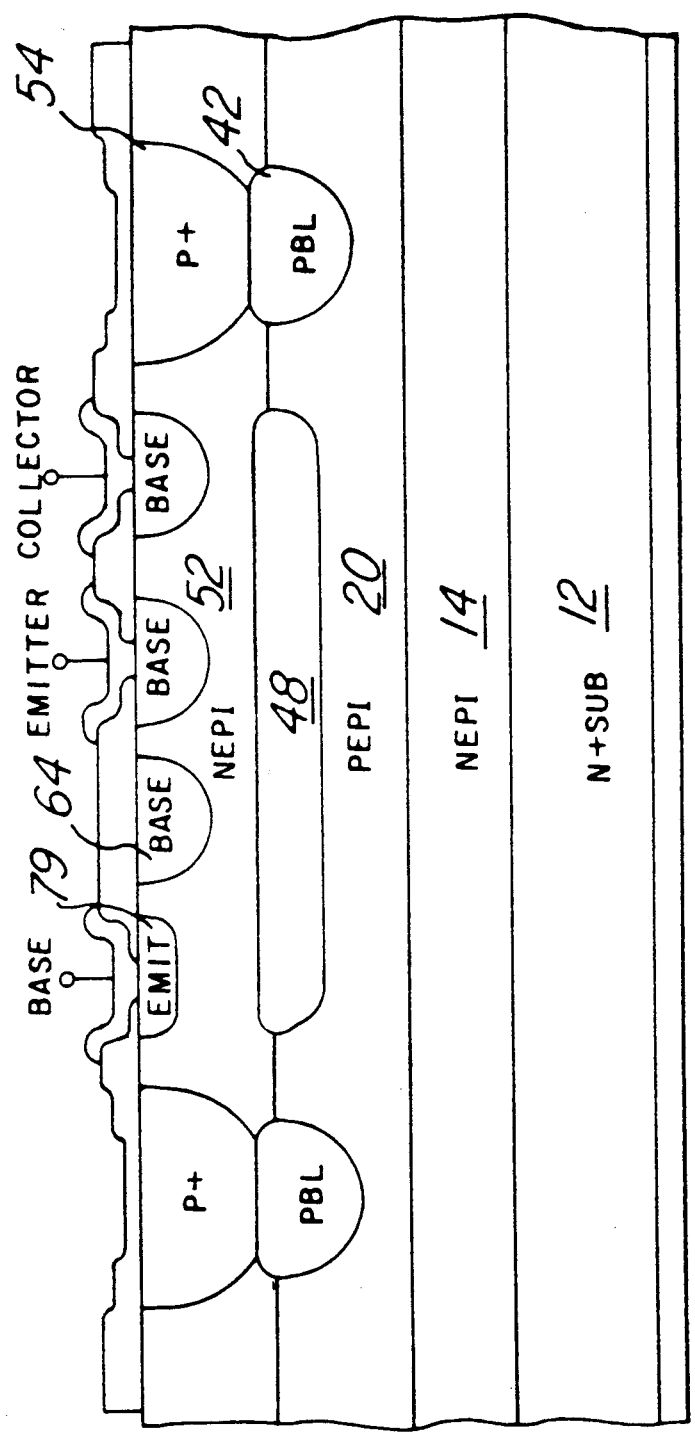

FIG. 15 depicts a bipolar high voltage lateral PNP transistor. This device has excellent characteristics as a switching transistor.

Figure 16:
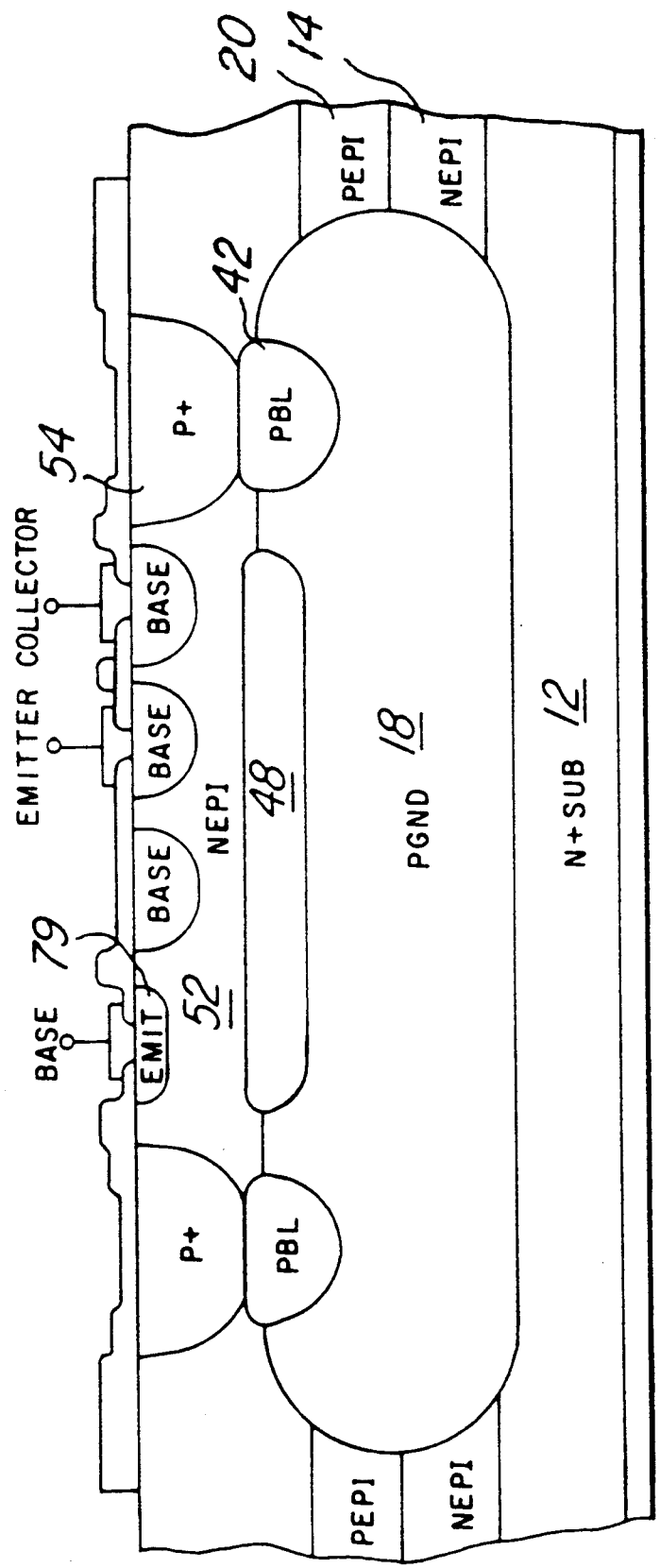

FIG. 16 depicts a bipolar low voltage lateral PNP transistor. This device has excellent characteristics as a logic device.

Figure 17:
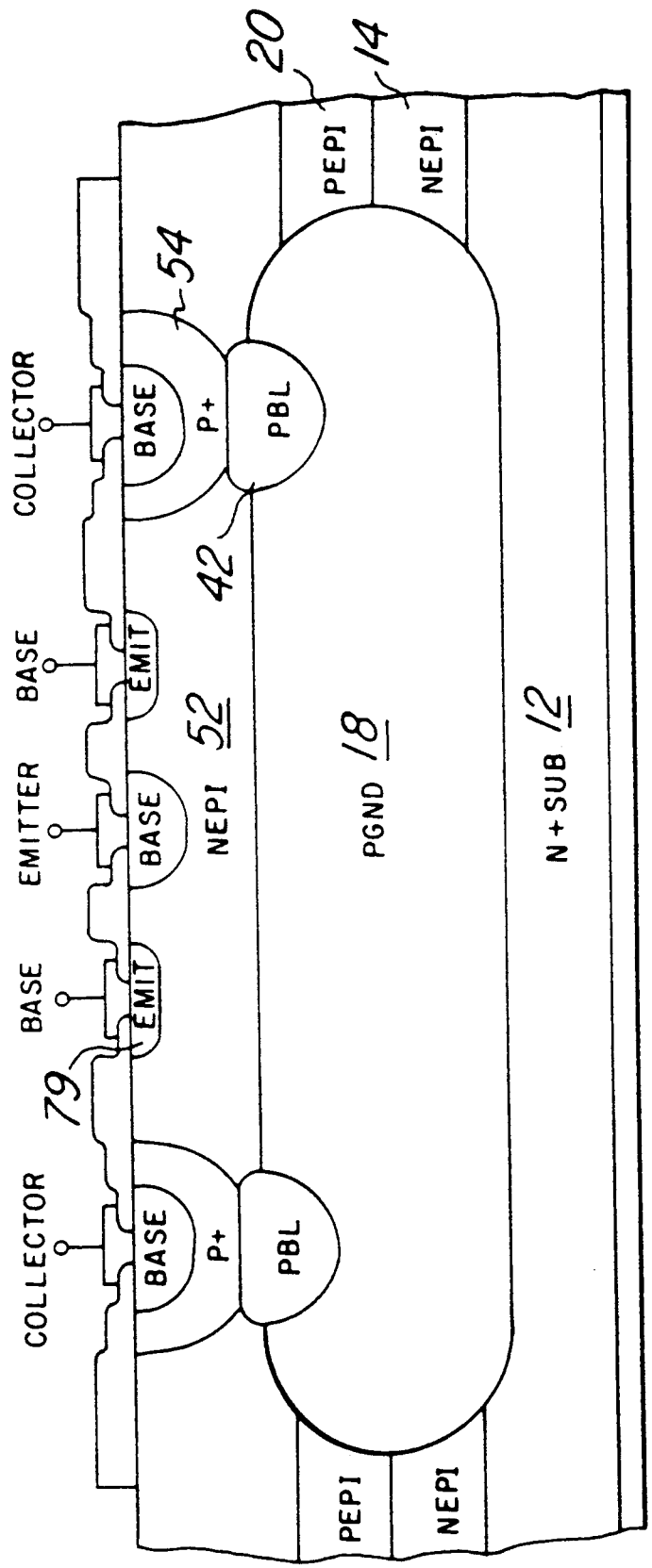

FIG. 17 depicts a bipolar low voltage substrate PNP transistor. This device has excellent characteristics as an analog and logic device.

Figure 18:
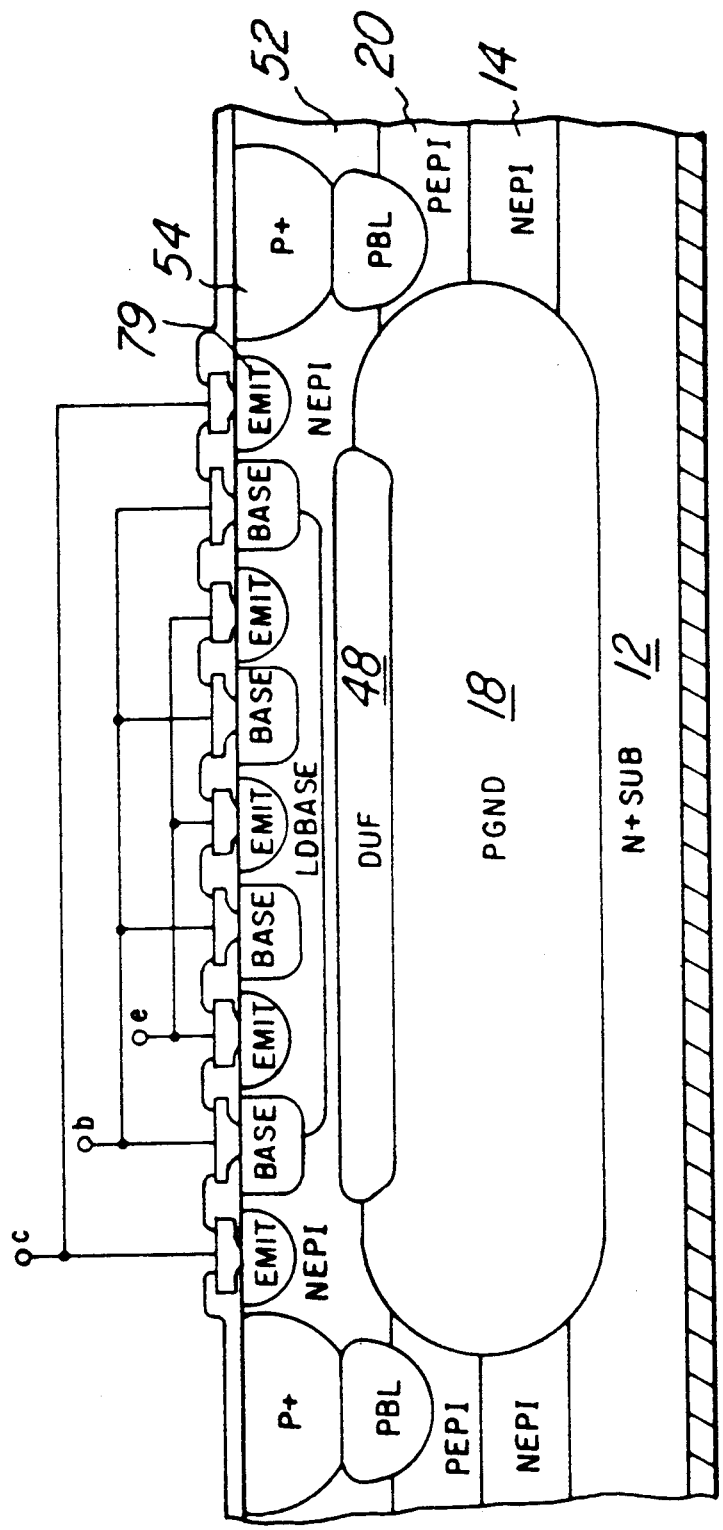

FIG. 18 depicts a Low Doped Base bipolar low voltage double diffused NPN transistor.

The present process flow lends itself to variations which would allow modification of device characteristics to meet desired device requirements. For example the first epitaxial layer can be split into higher and lower doped regions to provide a lower gradient of the doping profile to improve reverse bias safe operating area. Also the top epitaxial layer may be split into two sections so that a PBL and/or DUF may be placed between the two.

TECHNICAL ADVANTAGES OF THE INVENTION

From the foregoing, the process steps for fabricating a novel integrated circuit which combines on the same wafer/substrate high power, low power, logic, switching, analog, high current, low current, digital, and linear bipolar transistors along with CMOS transistors is disclosed. The present invention optimizes the characteristics of these different transistors in a single process flow. The present combination of multilayer epitaxial processing and conventional planar logic processes allows the present invention to achieve distinct technical advantages over processes and structures heretofore known. An example of one such technical advantage is that the vertical NPN output transistor of FIG. 11 is capable of delivering both high currents (in excess of 20 amps) and high voltages (in the range of 50 to 500 Volts) with excellent forward bias safe operating characteristics. These are even more outstanding characteristics considering that the device is fabricated as an integrated circuit by the same process flow used to fabricate low power and logic devices.

Another attendant technical advantage of the disclosed process is the fabrication of the vertical/lateral transistor of FIG. 14. This transistor is a very useful power component because of its isolated collector, disposed in the P+ isolation and P epitaxial regions. Additionally this bipolar transistor has exceptionally high current capability because its unique structure eliminates any parasitic collectors.

Yet another technical advantage of the present process and resultant IC structure is that the various epitaxial layers can be used for a variety of device functions. This allows the integration of the disclosed and other types of devices on a single chip. This chip integration allows the present device to perform functions which normally would require several differant types of integrated circuit chips. This results in a direct reduction in chip cost to achieve a desired circuit function. Which results in a reduction of the number of chips utilized. Which reduces the overall size of the end product. Examples of such multiple uses of the epitaxial layers include utilizing the P-epi layer as the base of the vertical NPN of FIG. 11, the collector of the vertical/lateral PNP of FIG. 14 and the isolation ground plane of the logic/analog circuitry.

The present process is easy to implement. This has the obvious technical advantage of reducing the cost of chip fabrication and increasing device yields.

Yet still another technical advantage of the present process is that the top epitaxial layer can support many different logic types including several variations of combined bipolar and CMOS (BiCMOS) depending on the needs of the application. Additionally lateral medium power Diffused Channel MOS (DMOS) and/or bipolar power structures can be designed into the process flow for various power applications. Thus it can be seen that the present single process can be used to fabricate virtually every conceivable type of transistor on one substrate. This allows interconnection of the devices to design integrated circuits capable of handling a multitude of circuit functions.

Yet another technical advantage of the present invention is that the top epitaxial layer additionally acts as an emitter resistor in the NPN power output transistor to ballast its operation and prevent thermal runaway.

Yet still another technical advantage of the multiple epitaxial construction of the present devices is that the process can be designed to allow the vertical NPN transistor to operate bi-directionally, enabling totem pole output configurations capable of delivering high current. Additionally the virtual substrate layer can be segmented by various buried diffusions allowing the construction of multiple unique structures.

The values and ranges discussed herein are given for a preferred embodiment of the present invention, of course these values may vary as the parameters are changed. Therefore, it is to be understood that many changes in detail may be made as a matter of engineering choices without departing from the spirit and scope of the invention, as defined by the appended claims.

It is an expected and intended use of the present integrated circuit device that it be operatively interconnected to construct electronic circuit devices capable of providing needed functions in automotive electronics, computer-peripheral applications, motor control circuits, etc. The versatility of the present process flow allows the fabrication of MOSFET, BiMOS, BiCMOS, and BiPOLAR technology including analog or digital high power or low power NPN, or PNP devices, without suffering from the problems of prior art device isolation.

What is claimed is:

1. A method for forming a semiconductor device, comprising the steps of:
   providing a semiconductor substrate having an impurity concentration of a first conductivity type;
   epitaxially growing a first semiconductor layer of said first conductivity type on a surface of said semiconductor substrate;
   selectively doping an impurity of a second conductivity type in said first semiconductor layer, so as to form a first high concentration buried region of the second conductivity type;
   epitaxially growing a second semiconductor layer of said second semiconductivity type on a surface of said first semiconductor layer in which said high concentration buried layer is formed;
   epitaxially growing a third semiconductor layer of said first conductivity type on a surface of said second semiconductor layer in which said second and third high concentration buried layers are formed; and
   selectively diffusing impurities of said first and second conductivity type from a main surface of said third semiconductor layer so as to form high concentration diffusion regions suitable for formation of semiconductor wells and semiconductor active regions.

2. The method of claim 1, wherein said selectively diffusing step comprises the steps of:
   selectively diffusing an impurity of said second conductivity type to form first, second, third, and fourth high concentration diffusion regions in said main surface of said third semiconductor layer, said first and second diffusion regions being disposed within said fourth and fifth buried regions respectively and forming collector regions, said third and fourth regions forming emitter regions within the main surface of the third semiconductor layer;
   selectively diffusing an impurity of said first conductivity type to form a fifth high concentration diffusion region in said main surface of said third semiconductor layer, said fifth diffusion region being disposed between said third and fourth diffusion regions and forming a base region.

3. The method of making the semiconductor device of claim 1, further comprising the steps of:
   selectively doping an impurity of a second conductivity type in a surface of said second semiconductor layer so as to form second and third high concentration buried regions of said second conductivity type; and
   selectively doping an impurity of said second conductivity type in a surface of said third semiconductor layer to form fourth and fifth high concentration buried regions of said second conductivity type to be in contact with said respective surfaces of said second and third high concentration buried regions.

4. The method of making the semiconductor device of claim 3, further comprising the steps of:
   concurrently forming during formation of said first high concentration buried region a sixth high concentration buried region of said second conductivity type in said first semiconductor layer corresponding to an area for formation of a second active semiconductor device;
   concurrently forming during formation of said second and third high concentration buried regions seventh and eighth high concentration buried regions of said second conductivity type in said second semiconductor layer area corresponding to said second active semiconductor device; and
   concurrently forming during formation of said fourth and fifth high concentration buried regions ninth and tenth high concentration buried regions of said second conductivity type in said third semiconductor layer area corresponding to said second active semiconductor device to be in contact with said respective surfaces of said seventh and eighth high concentration buried regions.

5. The method of making the semiconductor device of claim 4, wherein said selectively diffusing step comprises the steps of:
   selectively diffusing an impurity of said second conductivity type to form first, second, third, fourth and fifth high concentration diffusion regions in said main surface of said third semiconductor layer, said first, second, third, and fourth diffusions being disposed in an area corresponding to a first active semiconductor device, said fifth diffusion being in an area corresponding to said second active semiconductor device, said first and second diffusion regions being disposed within said fourth and fifth buried regions respectively and forming collector regions, said third and fourth regions forming emitter regions, said fifth region forming a base region;
   selectively diffusing an impurity of said first conductivity type to form sixth, seventh and eighth high concentration diffusion regions in said main surface of said third semiconductor layer, said sixth diffusion region being disposed between said third and fourth diffusion regions and forming a base region, said seventh diffusion being disposed within said fifth diffused base region on the third epitaxial layer of the second active device region and forming an emitter region, said eighth diffusion being disposed in an area corresponding to the third epitaxy of said second active semiconductor device and forming a collector region.

6. The method of forming a semiconductor device as recited in claim 4, further comprising the steps of forming an eleventh high concentration buried region of said first conductivity type in said second and first semiconductor surface in contact with said sixth high concentration buried region.

7. A method of forming a semiconductor device, comprising the steps:
   providing a semiconductor substrate having an impurity concentration of a first conductivity type;

epitaxially growing a first semiconductor layer of said first conductivity type on a surface of said semiconductor substrate;

epitaxially growing a second semiconductor layer of said second conductivity type on a surface of said first semiconductor layer;

selectively doping an impurity of said first conductivity type in a surface of said second semiconductor layer to form at least two buried isolation regions for isolating and defining an area for formation of a first active device;

selectively doping an impurity of a second conductivity type in a surface of said second semiconductor layer so as to form second and third high concentration buried regions of said second conductivity type;

selectively doping an impurity of said first conductivity type in a surface of said second semiconductor layer so as to form a fourth high concentration buried region of said first conductivity type;

epitaxially growing a third semiconductor layer of said first conductivity type on a surface of said second semiconductor layer in which said first, second, third and fourth high concentration buried layers are formed;

selectively doping an impurity of said second conductivity type in a surface of said third semiconductor layer to form fifth and sixth high concentration buried regions of said second conductivity type to be in contact with said respective surfaces of said second and third high concentration buried regions;

selectively diffusing impurities of said first and second conductivity type from a main surface of said third semiconductor layer so as to form high concentration diffusion regions suitable for formation of semiconductor wells and semiconductor active regions.

8. The method of forming a semiconductor device as recited in claim 7, wherein said diffusion step comprises the steps of:

selectively diffusing an impurity of said second conductivity type to form first and second high concentration diffusion regions in said main surface of said third semiconductor layer, said first and second diffusion regions being disposed within said fifth and sixth buried regions respectively and forming base regions;

selectively diffusing an impurity of said first conductivity type to form a third high concentration diffusion region in said main surface of said third semiconductor layer, said third diffusion region forming a base region; and further including the step of forming a collector contact on a surface of said semiconductor substrate opposite the surface in which said first semiconductor layer is formed.

9. The method of forming a semiconductor device as recited in claim 8, further comprising the steps of:

forming at least one bipolar analog transistor device on said third semiconductor layer, said analog device defining a second active device being isolated from said first active device to form a combined power transistor/analog transistor integrated circuit, wherein said first active device is a bipolar power transistor.

10. The method of forming a semiconductor device as recited in claim 7, wherein said diffusion step further comprises the steps of:

forming fourth, fifth, and sixth high concentration diffusion regions of said second conductivity type, said fourth region providing a well region for formation of a first MOS transistor, said fifth and sixth regions forming respective source and drain regions for a second MOS transistor; and forming seventh and eighth high concentration diffusion regions of said first conductivity type, said seventh and eighth diffusions being disposed in said fourth diffusion region and forming respective source and drain regions for said first MOS transistor.

* * * * *